(12) United States Patent
Fang

(10) Patent No.: US 10,804,478 B2
(45) Date of Patent: Oct. 13, 2020

(54) FOLDABLE DISPLAY PANEL, MANUFACTURING METHOD THEREOF AND FOLDABLE DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Hong Fang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/337,439

(22) PCT Filed: Dec. 25, 2018

(86) PCT No.: PCT/CN2018/123404
§ 371 (c)(1),
(2) Date: Mar. 28, 2019

(87) PCT Pub. No.: WO2020/118768
PCT Pub. Date: Jun. 18, 2020

(65) Prior Publication Data
US 2020/0185627 A1 Jun. 11, 2020

(30) Foreign Application Priority Data
Dec. 10, 2018 (CN) .......................... 2018 1 1503161

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3246* (2013.01); *H01L 27/3248* (2013.01);
(Continued)

(58) Field of Classification Search
CPC ... H01L 51/0097; H01L 51/003; H01L 51/56; H01L 27/3246; H01L 27/3248; H01L 27/3258; H01L 27/3262; H01L 27/1218; H01L 27/1248; H01L 27/1266; H01L 27/127; H01L 27/1288; H01L 29/42384;
(Continued)

(56) References Cited

U.S. PATENT DOCUMENTS

| 2018/0150170 A1* | 5/2018 | Oh ........................ H01L 51/003 |
| 2018/0188189 A1* | 7/2018 | Hwang .................. G01B 11/06 |
| 2018/0322826 A1* | 11/2018 | Lee ...................... H01L 27/3276 |

* cited by examiner

*Primary Examiner* — Tong-Ho Kim
(74) *Attorney, Agent, or Firm* — Mark M. Friedman

(57) ABSTRACT

Provided are a foldable display panel, a manufacturing method thereof and a foldable display device. The foldable display panel is improved by replacing the conventional inorganic insulating layer with a bending resistant organic insulating layer to improve the bendability of the display panel; meanwhile, the cross-interconnected metal foil layer is added between the organic insulating layers to improve the resilience after bending, thereby improving the reliability of the product while improving the bending resistance of the display panel.

9 Claims, 7 Drawing Sheets

(51) Int. Cl.
　　　*H01L 29/51*　　　(2006.01)
　　　*H01L 29/423*　　(2006.01)
　　　*H01L 51/56*　　　(2006.01)
　　　*H01L 29/49*　　　(2006.01)
　　　*H01L 27/12*　　　(2006.01)

(52) U.S. Cl.
　　　CPC ...... *H01L 27/3258* (2013.01); *H01L 27/3262* (2013.01); *H01L 29/42384* (2013.01); *H01L 29/4908* (2013.01); *H01L 29/513* (2013.01); *H01L 29/518* (2013.01); *H01L 51/003* (2013.01); *H01L 51/56* (2013.01); *H01L 27/127* (2013.01); *H01L 27/1218* (2013.01); *H01L 27/1248* (2013.01); *H01L 27/1266* (2013.01); *H01L 27/1288* (2013.01); *H01L 2227/323* (2013.01); *H01L 2227/326* (2013.01); *H01L 2251/5338* (2013.01); *H01L 2251/558* (2013.01)

(58) Field of Classification Search
　　　CPC . H01L 29/4908; H01L 29/513; H01L 29/518; H01L 2227/323; H01L 2227/326; H01L 2251/5338; H01L 2251/558
　　　USPC .......................................................... 257/72
　　　See application file for complete search history.

FOLDABLE DISPLAY PANEL, MANUFACTURING METHOD THEREOF AND FOLDABLE DISPLAY DEVICE

FIELD OF THE INVENTION

The present invention relates to a display technology field, and more particularly to a foldable display panel, a manufacturing method thereof and a foldable display device.

BACKGROUND OF THE INVENTION

Display products are currently booming. As consumer demand for notebooks, smartphones, TVs, tablets, smart watches and fitness wristbands continues to increase, more new display products will emerge in the future. In particular, the mainstream trend of smartphone display on the market is a comprehensive screen. As demand of people for ultra-thin and multi-form smartphones continues to increase, foldable smartphones may become a new direction and capacity breakthrough point for the display industry. Then, the technical requirements of the foldable smartphone and the reliability requirements of the product will be higher than the backplane technology, which is currently used.

Technical Problem

If the low temperature poly-silicon (LTPS) backplane technology of the prior art is directly transplanted to the foldable product, the foldable product may cause the backboard to be brittle and the reliability of the product becomes lower.

In view of the above, there is a need to provide a novel foldable display panel or display device to solve the above problems.

SUMMARY OF THE INVENTION

An objective of the present invention is to provide a foldable display panel, a manufacturing method thereof and a foldable display device. The foldable display panel is improved by replacing the conventional inorganic insulating layer with a bending resistant organic insulating layer to improve the bendability of the display panel; meanwhile, the cross-interconnected metal foil layer is added between the organic insulating layers to improve the resilience after bending, thereby improving the reliability of the product while improving the bending resistance of the display panel.

First, the present invention provides a foldable display panel, including: a flexible substrate on which a barrier layer, a buffer layer, an active layer, a gate insulating layer and a gate are sequentially stacked in a direction away from the flexible substrate, wherein a first organic insulating layer is disposed on the gate insulating layer and the gate, and the first organic insulating layer covers the gate, and a metal foil layer is disposed on the first organic insulating layer, and a second organic insulating layer is disposed on the metal foil layer; the first organic insulating layer and the second organic insulating layer are made of an organic material; the metal foil in the metal foil layer is a cross-connected mesh structure.

In one embodiment of the present invention, a polyimide layer, a barrier layer, a buffer layer, an active layer, a first gate insulating layer, a first gate, a second gate insulating layer and a second gate are sequentially stacked between the flexible substrate and the first organic insulating layer in a direction away from the flexible substrate.

In one embodiment of the present invention, a source and a drain are disposed in the second organic insulating layer, the metal foil layer, the first organic insulating layer, the second gate insulating layer and the first gate insulating layer; a planarization layer is disposed on the second organic insulating layer, and an anode layer, a pixel defining layer and a spacer disposed on the pixel defining layer are disposed on the planarization layer.

In one embodiment of the present invention, the buffer layer includes: a first buffer layer, a second buffer layer and a third buffer layer which are sequentially stacked in a direction away from the flexible substrate, and the first buffer layer is made of a silicon nitride material, and the second buffer layer is made of a silicon oxide material, and the third buffer layer is made of an amorphous silicon material; the first buffer layer has a thickness of 500 angstroms, the second buffer layer has a thickness of 2000 to 3000 angstroms, and the third buffer layer has a thickness of 400 to 500 angstroms.

In one embodiment of the present invention, the gate insulating layer includes a first gate insulating layer and a second gate insulating layer, and the gate includes a first gate and a second gate; wherein the first gate insulating layer, the first gate, the second gate insulating layer and the second gate are sequentially stacked in a direction away from the flexible substrate.

In one embodiment of the present invention, the first gate insulating layer is made of a silicon oxide material, and the first gate insulating layer has a thickness of 900 to 1500 angstroms; the second gate insulating layer is made of a silicon nitride material, and the second gate insulating layer has a thickness of 1000 to 1300 angstroms.

Moreover, the present invention provides a foldable display device, wherein the foldable display device comprises one of the aforesaid foldable display panels.

Furthermore, the present invention provides a manufacturing method of a foldable display panel, including steps of: (a) providing the flexible substrate; (b) providing the barrier layer on the flexible substrate; (c) depositing a silicon nitride layer, a silicon oxide layer and an amorphous silicon layer sequentially on the barrier layer to form the buffer layer; (d) forming the active layer on the buffer layer, and performing exposure development, etching and stripping processes on the active layer to pattern the active layer; (e) disposing a first gate insulating layer on the active layer and the buffer layer, wherein the first gate insulating layer covers the active layer, and depositing a first metal layer on the first gate insulating layer, and patterning the first metal layer to form a first gate; (f) disposing a second gate insulating layer on the first gate insulating layer and the first gate, wherein the second gate insulating layer covers the first gate, and depositing a second metal layer on the second gate insulating layer, and patterning the second metal layer to form a second gate and constructing a storage capacitor; (g) forming the first organic insulating layer on the second gate insulating layer and the second gate; (h) depositing a metal layer on the first organic insulating layer, and patterning the metal layer to form the metal foil layer; and (i) forming the second organic insulating layer on the metal foil layer.

In one embodiment of the present invention, the method further includes a step of forming a first via and a second via in the first organic insulating layer by a mask process in Step (g).

In one embodiment of the present invention, the method further includes a step of forming a third via and a fourth via in the second organic insulating layer, the metal foil layer, the first organic insulating layer, the first gate insulating layer and the second gate insulating layer by a mask process and an etching process, wherein positions of the third via and the fourth via respectively correspond to positions of the first via and the second via in Step (i).

In one embodiment of the present invention, after Step (i), the method further includes steps of: (i1) filling the third via and the fourth via with a metal material to form a source and a drain, respectively; (i2) coating a resin on the second organic insulating layer to form a planarization layer, and forming an anode layer and a pixel defining layer on the planarization layer, and patterning the anode layer; and (i3) forming a hole in the pixel defining layer, and disposing a spacer on the pixel defining layer.

Beneficial Effect

The benefits of the present invention are that the foldable display panel, the manufacturing method thereof and the foldable display device of the present invention. The conventional inorganic insulating layer is replaced with a bending resistant organic insulating layer to improve the bendability of the display panel; meanwhile, the cross-interconnected metal foil layer is added between the organic insulating layers to improve the resilience after bending, thereby improving the reliability of the product while improving the bending resistance of the display panel.

BRIEF DESCRIPTION OF THE DRAWINGS

In order to more clearly illustrate the embodiments of the present invention, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
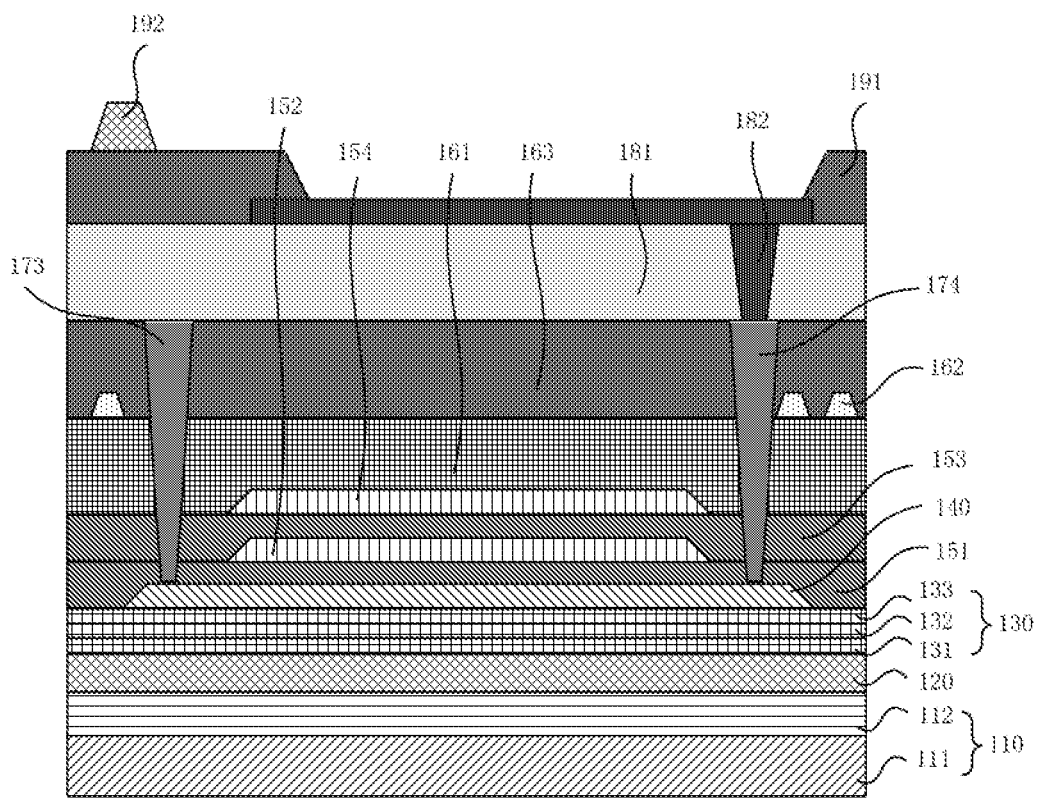
FIG. 1 is a structural diagram of a foldable display panel in an embodiment of the present invention.

For better explaining the technical solution and the effect of the present invention, the present invention will be further described in detail with the accompanying drawings in the specific embodiments. It is clear that the described embodiments are merely part of embodiments of the present invention, but not all embodiments. Based on the embodiments of the present invention, all other embodiments to those of skilled in the premise of no creative efforts obtained, should be considered within the scope of protection of the present invention.

The terms "first", "second", "third", etc. (if present) in the specification and claims of the present invention and the foregoing figures are used to distinguish similar objects, and are not necessary used to describe for a particular order or sequence. It should be understood that the objects so described are interchangeable as appropriate. Furthermore, the terms "including" and "having" and their any deformations are intended to cover non-exclusive inclusion.

The drawings, which are discussed below, and the various embodiments used to describe the principles of the present invention are intended to be illustrative only and not to limit the scope of the disclosure of the present invention. Those skilled in the art will appreciate that the principles of the present invention can be implemented in any properly arranged system. Exemplary embodiments will be described in detail, and examples of these embodiments are illustrated in the accompanying drawings. Furthermore, a terminal according to an exemplary embodiment will be described in detail with reference to the accompanying drawings. The same reference numerals in the drawings denote the same elements.

The terms used in the description of the present invention are intended to describe a particular embodiment, and are not intended to illustrate the concept of the invention. An expression used in the singular encompasses the plural form of expression unless the context clearly dictates otherwise. In the present specification, it should be understood that terms such as "including", "having" and "comprising" and like terms are intended to specify the possibility of the presence of disclosed features, numbers, steps, actions, components, parts, or combinations thereof in the description of the present invention, and are not intended to preclude the possibility of the presence or addition of one or more other features, numbers, steps, actions, components, parts or combinations thereof. The same reference numerals in the drawings denote the same parts.

The embodiment of the present invention provides a foldable display panel. The detail descriptions are respectively introduced below.

Please refer to FIG. 1. FIG. 1 is a structural diagram of a foldable display panel in an embodiment of the present invention. The foldable display panel 100 of the present invention includes: a flexible substrate 110 on which a barrier layer 120, a buffer layer 130, an active layer 140, a gate insulating layer (including a first gate insulating layer 151 and a second gate insulating layer 153) and a gate (a first gate 152 and a second gate 154) are sequentially stacked in a direction away from the flexible substrate 110.

Specifically, the flexible substrate 110 may be formed by coating a polyimide material 112 on a glass substrate 111 and curing the same. Certainly, a polyethylene terephthalate material may also be coated on the glass substrate 111 to form the corresponding flexible substrate 110. Since the polyimide material 112 possesses advantages of wide temperature, chemical resistance and high strength. Thus, the resulting substrate possesses good flexibility. Specifically, the flexible substrate 110 is peeled off from the glass substrate 111 before the foldable display panel 100 is formed.

The barrier layer 120 is formed of a silicon nitride SiNx material or a silicon dioxide SiO2 material or a laminate material composed of the aforesaid two materials.

The buffer layer 130 includes an oxide (e.g. silicon oxide, SiOx) and/or a nitride (e.g. silicon nitride, SiNx). Preferably, the buffer layer 130 includes: a first buffer layer 131, a second buffer layer 132 and a third buffer layer 133 which are sequentially stacked in a direction away from the flexible substrate 110, and the first buffer layer 131 is made of a silicon nitride SiNx material, and the second buffer layer 132 is made of a silicon oxide SiOx material, and the third buffer layer 133 is made of an amorphous silicon a-Si material. The first buffer layer 131 has a thickness of 500 angstroms, and the second buffer layer 132 has a thickness of 2000 to 3000 angstroms, and the third buffer layer 133 has a thickness of 400 to 500 angstroms. The arrangement of the first buffer layer 131 and the second buffer layer 132 can better buffer the damage of the substrate during the manufacturing process. Meanwhile, the first buffer layer 131 is made of the silicon nitride material, and as the silicon nitride material is prepared, a hydrogen element can be generated for repairing the low temperature polysilicon layer (i.e., the active layer 140 described later), and the electrical performance of the low temperature polysilicon layer is improved. The second buffer layer 132 is made of the silicon oxide material for improving the stress of the second buffer layer 132 and preventing the second buffer layer 132 from falling off.

The active layer 140 is formed on the buffer layer 130 by using a low temperature polysilicon (LTPS) process. The low temperature polysilicon process includes an excimer laser annealing (ELA) process. Besides, the active layer 140 is subjected to exposure, development, etching and stripping processes to pattern the active layer 140.

In this embodiment, the gate insulating layer includes a first gate insulating layer 151 and a second gate insulating layer 153, and the gate includes a first gate 152 and a second gate 154; wherein the first gate insulating layer 151, the first gate 152, the second gate insulating layer 153 and the second gate 154 are sequentially stacked in a direction away from the flexible substrate 110.

The first gate insulating layer 151 is made of a silicon oxide material, and the first gate insulating layer 151 has a thickness of 900 to 1500 angstroms. The second gate insulating layer 153 is made of a silicon nitride material, and the second gate insulating layer 153 has a thickness of 1000 to 1300 angstroms. In this embodiment, a first gate insulating layer 151 on the patterned active layer 140 and the buffer layer 130, and the first gate insulating layer 151 covers the patterned active layer 140. A first metal layer is deposited on the first gate insulating layer 151, and the first metal layer is patterned to form a first gate 152. Meanwhile, a second gate insulating layer 153 is disposed on the first gate insulating layer 151 and the first gate 152, and the second gate insulating layer 153 covers the first gate 152. A second metal layer is deposited on the second gate insulating layer 153, and the second metal layer is patterned to form a second gate 154, thereby a storage capacitor is constructed by the first gate 152 and the second gate 154.

Certainly, in other embodiments, the gate insulating layer may also be only a gate insulating layer of single layer, and the gate is only a gate of single layer.

A first organic insulating layer 161 is disposed on the gate insulating layer and the gate. Please refer to FIG. 1. In this embodiment, the first organic insulating layer 161 is disposed on the second gate insulating layer 153 and the second gate 154. The first organic insulating layer 161 covers the second gate 154, and a metal foil layer 162 is disposed on the first organic insulating layer 161, and a second organic insulating layer 163 is disposed on the metal foil layer 162. Namely, the metal foil layer 162 is disposed between the first organic insulating layer 161 and the second organic insulating layer 163. Specifically, in other embodiments of the present invention, the active substrate 140 may be the only layer disposed between the flexible substrate 110 and the gate insulating layer, the gate, and the barrier layer 120 and the buffer layer 130 are not disposed.

The first organic insulating layer 161 and the second organic insulating layer 163 are made of an organic material that is resistant to bending and possesses excellent flexibility. The first organic insulating layer 161 and the second organic insulating layer 163 replace the inorganic insulating layer in the display panel of the prior art, thereby improving the bending resistance of the foldable display panel 100. The metal foil in the metal foil layer 162 is a cross-connected mesh structure. The metal foil layer 162 is configured to improve the resilience of the foldable display panel 100 after bending, thereby improving the reliability of the product while improving the bending resistance of the foldable display panel 100.

Furthermore, in this embodiment, a source 173 and a drain 174 are disposed in the second organic insulating layer 163, the metal foil layer 162, the first organic insulating layer 161, the second gate insulating layer 153 and the first gate insulating layer 151. Since a third via 171 and a fourth via 172 are formed in the second organic insulating layer 163, the metal foil layer 162, the first organic insulating layer 161, the second gate insulating layer 153 and the first gate insulating layer 151, and the third via 171 and the fourth via 172 are subjected to a conductor treatment, for instance, to be filled with a metal material to form the source 173 and the drain 174, respectively.

Further, a planarization layer 181 and an anode layer 182 are sequentially stacked on the second organic insulating layer 163 in a direction away from the flexible substrate 110. The planarization layer 181 is formed by coating a resin on the second organic insulating layer 163. After the planarization layer 181 is formed, indium tin oxide (ITO) or indium zinc oxide (IZO) is sputtered on the planarization layer 181 to form the anode layer 182, and the anode layer 182 is patterned. The anode layer 182 is a transparent conductive film. In addition, a pixel defining layer 191 is further disposed on the planarization layer 181. The pixel defining layer 191 possesses an opening for exposing a portion of the anode layer 182. The pixel definition layer 191 is used to determine the distribution of red sub-pixels, green sub-pixels and blue sub-pixels (i.e., RGB).

Furthermore, as can be understood by those skilled in the art, an organic light emitting layer (not shown) is disposed in the opening. A transparent cathode layer (not shown) above the opening is disposed in parallel with the anode layer 182 via the organic light emitting layer, and the organic material of the organic light emitting layer is illuminated by the voltage difference between the anode layer 182 and the provided cathode layer. Besides, the organic emitting layer generally comprises a Hole Injection Layer (HIL), a Hole Transporting Layer (HTL), an emitting material layer (EML), an Electron Transport Layer (ETL) and an Electron Injection Layer (EIL), and the structure is well known to those skilled in the art and is not shown in the drawings.

Furthermore, spacers 192 are disposed on the pixel defining layer 191 at intervals. The spacers 192 serve to support and isolate in a physical space.

The foldable display panel 100 is improved in design by replacing the conventional inorganic insulating layer with a bending resistant organic insulating layer to improve the bendability of the display panel; meanwhile, the cross-interconnected metal foil layer 162 is added between the organic insulating layers to improve the resilience after bending, thereby improving the reliability of the product while improving the bending resistance of the display panel.

Figure 2:
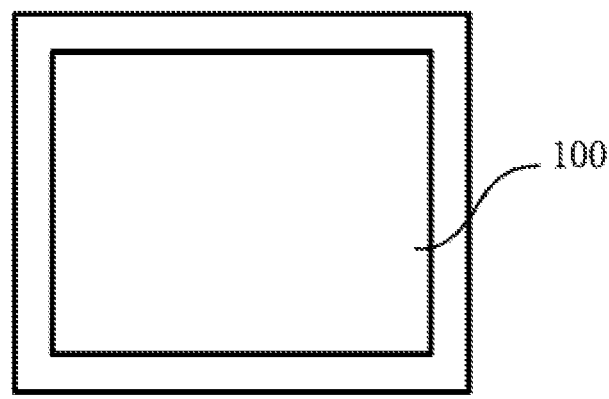
FIG. 2 is a diagram of a foldable display device in an embodiment of the present invention.

Please refer to FIG. 2. FIG. 2 is a structural diagram of a foldable display device in an embodiment of the present invention. The present invention also provides a foldable display device 200. The foldable display device 200 includes the aforesaid foldable display panel 100. The specific structure of the foldable display panel 100 is as described above and will not be described herein.

Figure 3:
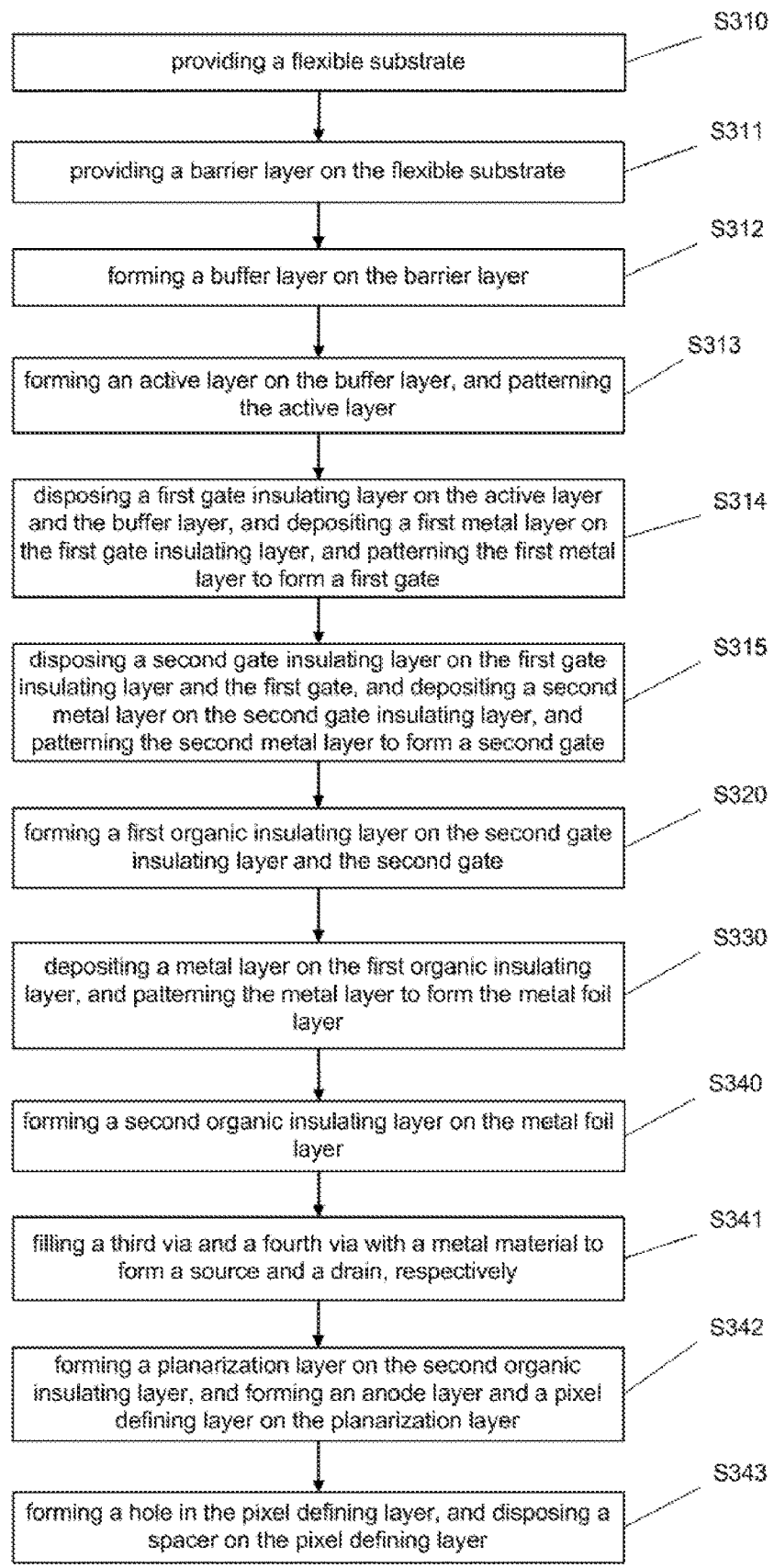
FIG. 3 is a flowchart showing steps of a manufacturing method of a foldable display panel in an embodiment of the present invention.

Please refer to FIG. 3. FIG. 3 is a flowchart showing steps of a manufacturing method of a foldable display panel in an embodiment of the present invention. FIGS. 4A to 4L are process flow diagrams of a manufacturing method of a foldable display panel in the embodiment of the present invention.

The present invention also provides a manufacturing method of the foregoing foldable display panel. The specific structure of the foldable display panel 100 is as described above, and details are not described herein again. The method comprises:

Step S310, providing the flexible substrate.

Figure 4A:
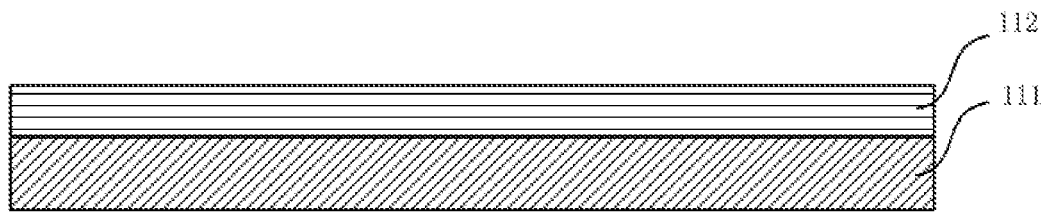
FIGS. 4A to 4L are process flow diagrams of a manufacturing method of a foldable display panel in the embodiment of the present invention.

As shown in FIG. 4A, a specific process for providing the flexible substrate is to apply the polyimide material on the glass substrate to cure to form the polyimide layer. Since the polyimide material possesses advantages of wide temperature, chemical resistance and high strength. Thus, the resulting substrate possesses good flexibility.

Figure 4B:
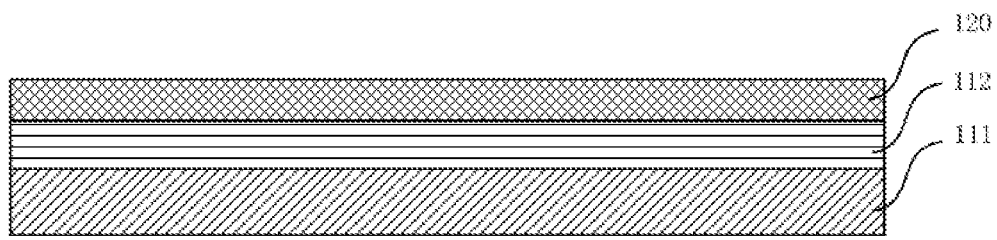

Referring to FIG. 4B, Step S311: providing the barrier layer on the flexible substrate, wherein the barrier layer covers the flexible substrate.

The barrier layer 120 is formed of a silicon nitride SiNx material or a silicon dioxide SiO2 material or a laminate material composed of the aforesaid two materials.

Figure 4C:
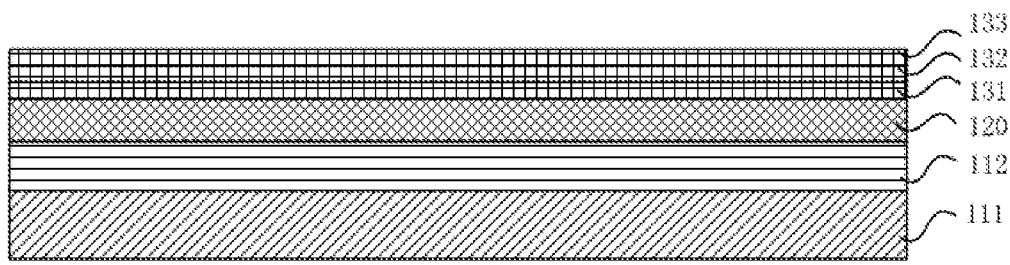

Referring to FIG. 4C, Step S312: depositing a silicon nitride layer, a silicon oxide layer and an amorphous silicon layer sequentially on the barrier layer to form the buffer layer 130.

The buffer layer 130 includes an oxide (e.g. silicon oxide, SiOx) and/or a nitride (e.g. silicon nitride, SiNx). Preferably, the buffer layer 130 includes: a first buffer layer 131, a second buffer layer 132 and a third buffer layer 133 which are sequentially stacked in a direction away from the flexible substrate 110, and the first buffer layer 131 is made of a silicon nitride SiNx material, and the second buffer layer 132 is made of a silicon oxide SiOx material, and the third buffer layer 133 is made of an amorphous silicon a-Si material. The first buffer layer 131 has a thickness of 500 angstroms, and the second buffer layer 132 has a thickness of 2000 to 3000 angstroms, and the third buffer layer 133 has a thickness of 400 to 500 angstroms. The arrangement of the first buffer layer 131 and the second buffer layer 132 can better buffer the damage of the substrate during the manufacturing process. Meanwhile, the first buffer layer 131 is made of the silicon nitride material, and as the silicon nitride material is prepared, a hydrogen element can be generated for repairing the low temperature polysilicon layer (i.e., the active layer 140 described later), and the electrical performance of the low temperature polysilicon layer is improved. The second buffer layer 132 is made of the silicon oxide material for improving the stress of the second buffer layer 132 and preventing the second buffer layer 132 from falling off.

Figure 4D:
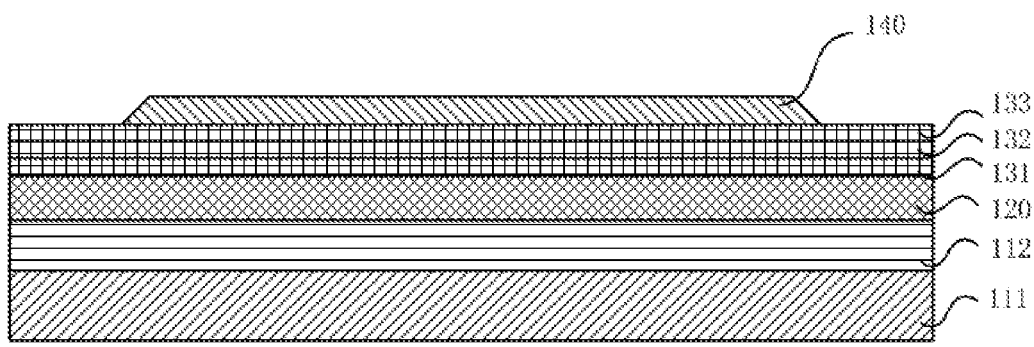

Referring to FIG. 4D, Step S313: forming the active layer on the buffer layer by using an excimer laser crystallization process, and performing exposure development, etching and stripping processes on the active layer to pattern the active layer.

The active layer 140 is formed on the buffer layer 130 by using a low temperature polysilicon (LTPS) process. The low temperature polysilicon process includes an excimer laser annealing (ELA) process. Besides, the active layer 140 is subjected to exposure, development, etching and stripping processes to pattern the active layer 140.

Figure 4E:
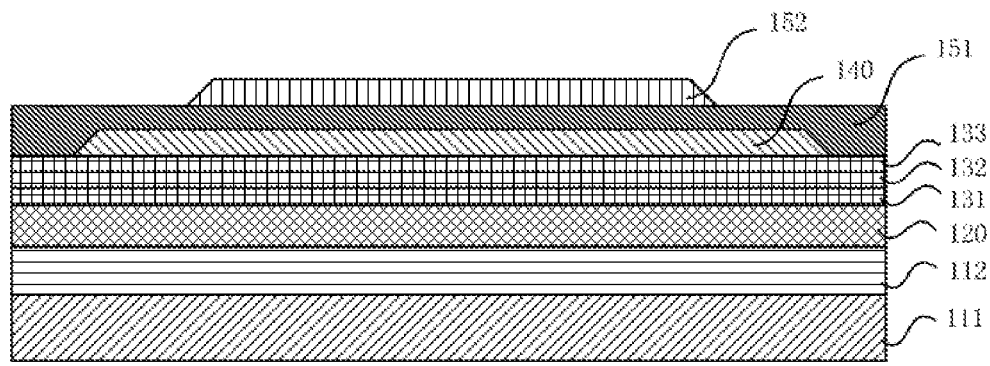

Referring to FIG. 4E, Step S314: disposing a first gate insulating layer on the active layer and the buffer layer, wherein the first gate insulating layer covers the active layer, and depositing a first metal layer on the first gate insulating layer, and patterning the first metal layer to form a first gate.

Figure 4F:
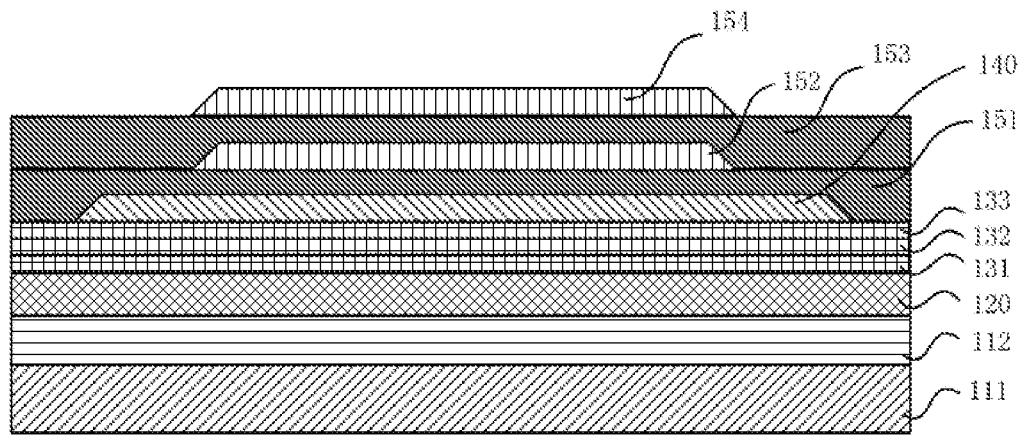

Referring to FIG. 4F, Step S315: disposing a second gate insulating layer on the first gate insulating layer and the first gate, wherein the second gate insulating layer covers the first gate, and depositing a second metal layer on the second gate insulating layer, and patterning the second metal layer to form a second gate and constructing a storage capacitor.

In this embodiment, the gate insulating layer includes a first gate insulating layer 151 and a second gate insulating layer 153, and the gate includes a first gate 152 and a second gate 154; wherein the first gate insulating layer 151, the first gate 152, the second gate insulating layer 153 and the second gate 154 are sequentially stacked in a direction away from the flexible substrate 110. The first gate insulating layer 151 is made of a silicon oxide material, and the first gate insulating layer 151 has a thickness of 900 to 1500 angstroms. The second gate insulating layer 153 is made of a silicon nitride material, and the second gate insulating layer 153 has a thickness of 1000 to 1300 angstroms.

Figure 4G:
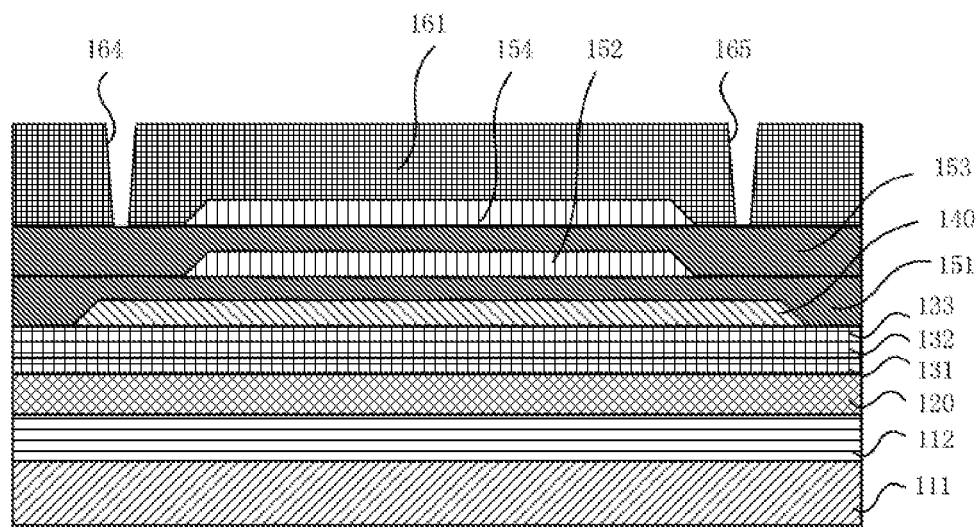

Referring to FIG. 4G, Step S320, forming the first organic insulating layer on the second gate insulating layer and the second gate by coating, exposure, development and annealing processes.

Specifically, in this embodiment, the first organic insulating layer 161 is disposed on the second gate insulating layer 153 and the second gate 154. Certainly, in other embodiments, the gate insulating layer may also be only a gate insulating layer of single layer, and the gate is only a gate of single layer. At this time, the first organic insulating layer 161 is disposed on the first gate insulating layer 151 and the first gate 152. Therefore, in either case, the first organic insulating layer 161 is disposed on the gate insulating layer and the gate.

In Step S320, a first via 164 and a second via 165 are formed in the first organic insulating layer by a mask process.

Figure 4H:
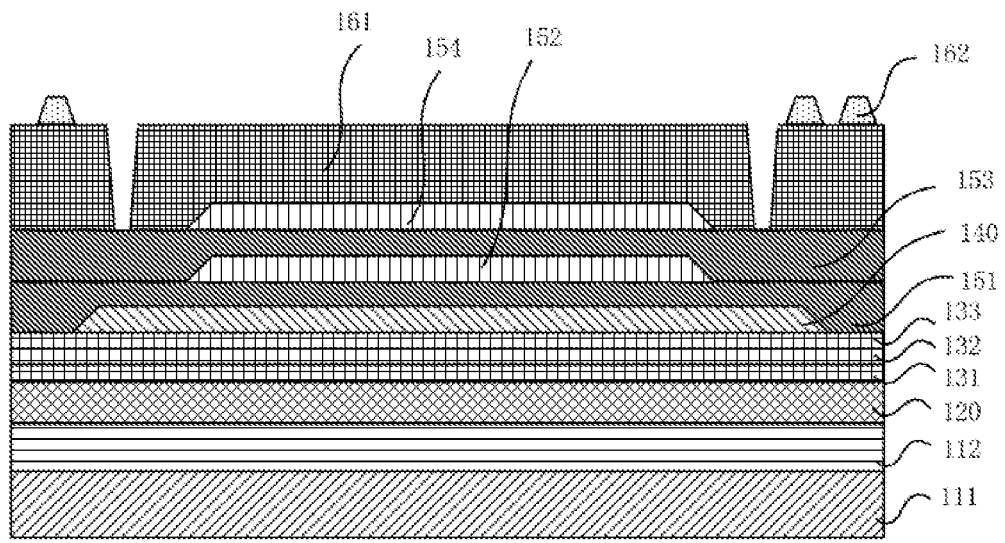

Referring to FIG. 4H, Step S330: depositing a metal layer on the first organic insulating layer, and patterning the metal layer to form the metal foil layer.

The metal foil in the metal foil layer 162 is a cross-connected mesh structure. The metal foil layer 162 is configured to improve the resilience of the foldable display panel 100 after bending, thereby improving the reliability of the product while improving the bending resistance of the foldable display panel 100.

Figure 4I:
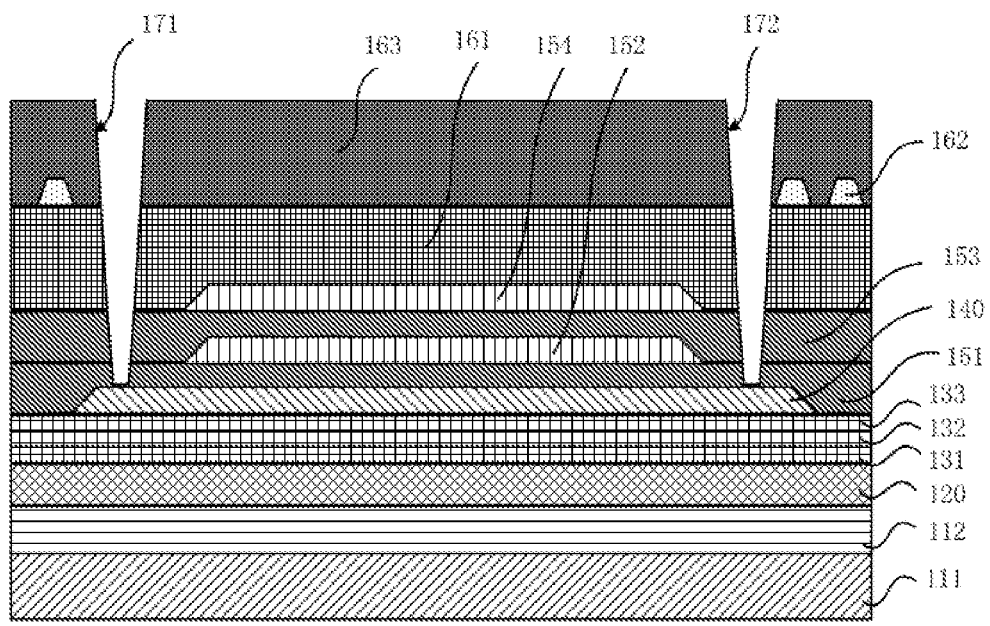

Referring to FIG. 4I, Step S340, forming the second organic insulating layer on the metal foil layer by coating, exposure, development and annealing processes.

The first organic insulating layer 161 and the second organic insulating layer 163 are made of an organic material that is resistant to bending and possesses excellent flexibility. The first organic insulating layer 161 and the second organic insulating layer 163 replace the inorganic insulating layer in the display panel of the prior art, thereby improving the bending resistance of the foldable display panel 100.

Besides, in Step S340, a third via 171 and a fourth via 172 are formed in the second organic insulating layer 163, the metal foil layer 162, the first organic insulating layer 161, the first gate insulating layer 151 and the second gate insulating layer 153 by a mask process and an etching process, and positions of the third via 171 and the fourth via 172 respectively correspond to positions of the first via 164 and the second via 165.

Figure 4J:
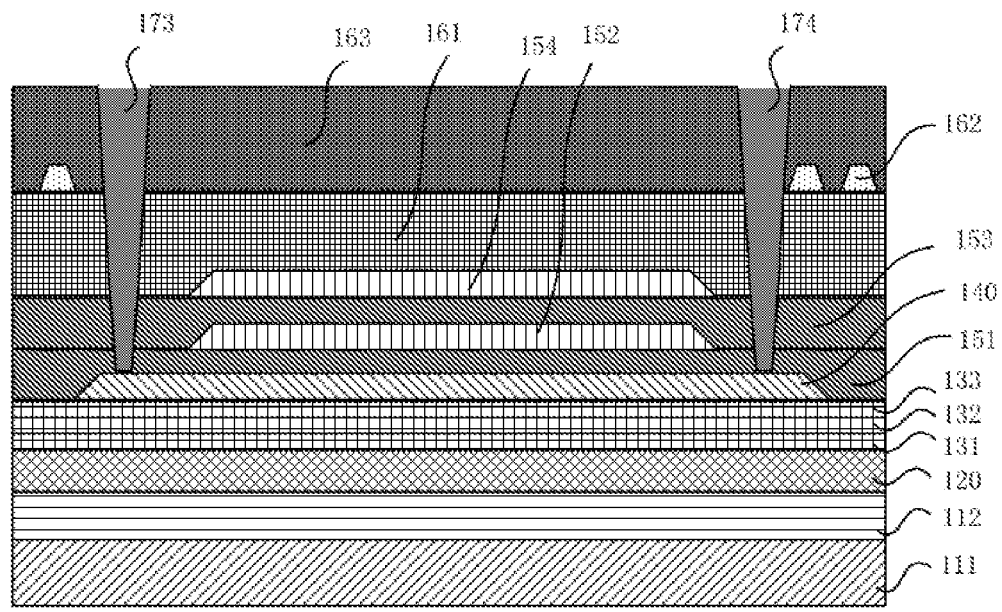

In one embodiment of the present invention, after Step 340, the method further includes steps of:

Referring to FIG. 4J, Step S341: filling the third via 171 and the fourth via 172 with a metal material to form a source 173 and a drain 174, respectively.

Figure 4K:
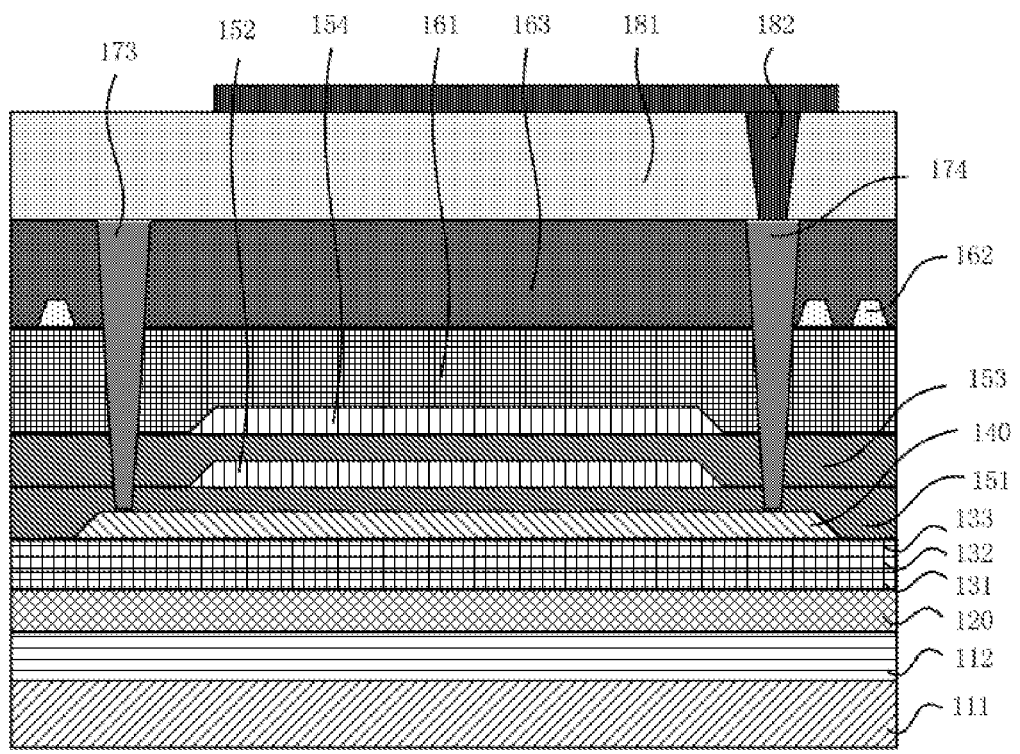

Referring to FIG. 4K, Step S342: coating a resin on the second organic insulating layer to form a planarization layer, and forming an anode layer and a pixel defining layer on the planarization layer, and patterning the anode layer 182.

Specifically, in this embodiment, the planarization layer 181 is formed by coating a resin on the second organic insulating layer 163. After the planarization layer 181 is formed, indium tin oxide (ITO) is sputtered on the planarization layer 181 to form the anode layer 182. The anode layer 182 is a transparent conductive film. In addition, a pixel defining layer 191 is further disposed on the planarization layer 181.

Figure 4L:
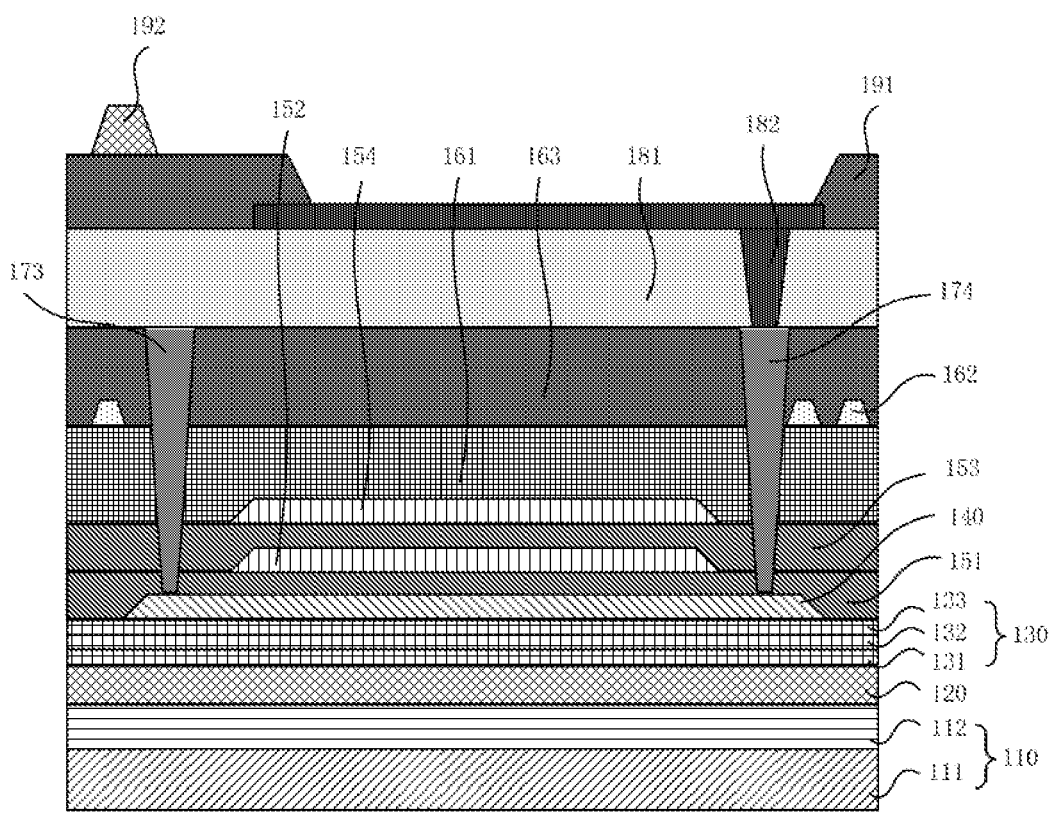

Referring to FIG. 4L, Step S343: forming a hole in the pixel defining layer, and disposing a spacer on the pixel defining layer.

The pixel defining layer 191 possesses an opening for exposing a portion of the anode layer 182. The pixel definition layer 191 is used to determine the distribution of red sub-pixels, green sub-pixels and blue sub-pixels (i.e., RGB).

Furthermore, not shown in figures, it can be understood by those skilled in the art, an organic light emitting layer (not shown) is disposed in the opening. A transparent cathode layer above the opening is disposed in parallel with the anode layer 182 via the organic light emitting layer, and the organic material of the organic light emitting layer is illuminated by the voltage difference between the anode layer 182 and the provided cathode layer.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

INDUSTRIAL APPLICABILITY

The subject matter of the present application can be manufactured and used in the industry with industrial applicability.

What is claimed is:

1. A foldable display panel, including: a flexible substrate on which a barrier layer, a buffer layer, an active layer, a gate insulating layer and a gate are sequentially stacked in a direction away from the flexible substrate, wherein a first organic insulating layer is disposed on the gate insulating layer and the gate, and the first organic insulating layer covers the gate, and a metal foil layer is disposed on the first organic insulating layer, and a second organic insulating layer is disposed on the metal foil layer; the first organic insulating layer and the second organic insulating layer are made of an organic material; a metal foil in the metal foil layer is a cross-connected mesh structure;

wherein a source and a drain are disposed in the second organic insulating layer, the metal foil layer, the first organic insulating layer, the second gate insulating layer and the first gate insulating layer; a planarization layer is disposed on the second organic insulating layer, and an anode layer, a pixel defining layer and a spacer disposed on the pixel defining layer are disposed on the planarization layer.

2. The foldable display panel according to claim 1, wherein the buffer layer includes: a first buffer layer, a second buffer layer and a third buffer layer which are sequentially stacked in a direction away from the flexible substrate, and the first buffer layer is made of a silicon nitride material, and the second buffer layer is made of a silicon oxide material, and the third buffer layer is made of an amorphous silicon material.

3. The foldable display panel according to claim 1, wherein the gate insulating layer includes a first gate insulating layer and a second gate insulating layer, and the gate includes a first gate and a second gate; wherein the first gate insulating layer, the first gate, the second gate insulating layer and the second gate are sequentially stacked in a direction away from the flexible substrate.

4. The foldable display panel according to claim 3, wherein the first gate insulating layer is made of a silicon oxide material, and the second gate insulating layer is made of a silicon nitride material.

5. A foldable display device, wherein the foldable display device includes the foldable display panel according to claim 1.

6. A manufacturing method of the foldable display panel according to claim 1, including steps of:
 (a) providing the flexible substrate;
 (b) providing the barrier layer on the flexible substrate;
 (c) depositing a silicon nitride layer, a silicon oxide layer and an amorphous silicon layer sequentially on the barrier layer to form the buffer layer;
 (d) forming the active layer on the buffer layer, and performing exposure development, etching and stripping processes on the active layer to pattern the active layer;
 (e) disposing a first gate insulating layer on the active layer and the buffer layer, wherein the first gate insulating layer covers the active layer, and depositing a first metal layer on the first gate insulating layer, and patterning the first metal layer to form a first gate;
 (f) disposing a second gate insulating layer on the first gate insulating layer and the first gate, wherein the second gate insulating layer covers the first gate, and depositing a second metal layer on the second gate insulating layer, and patterning the second metal layer to form a second gate and constructing a storage capacitor;
 (g) forming the first organic insulating layer on the second gate insulating layer and the second gate;
 (h) depositing a metal layer on the first organic insulating layer, and patterning the metal layer to form the metal foil layer; and
 (i) forming the second organic insulating layer on the metal foil layer.

7. The manufacturing method of the foldable display panel according to claim 6, further including a step of forming a first via and a second via in the first organic insulating layer by a mask process in Step (g).

8. The manufacturing method of the foldable display panel according to claim 7, further including a step of forming a third via and a fourth via in the second organic insulating layer, the metal foil layer, the first organic insulating layer, the first gate insulating layer and the second gate insulating layer by a mask process and an etching process, wherein positions of the third via and the fourth via respectively correspond to positions of the first via and the second via in Step (i).

9. The manufacturing method of the foldable display panel according to claim 8, wherein after Step (i), the method further includes steps of:
 (i1) filling the third via and the fourth via with a metal material to form a source and a drain, respectively;

(i2) coating a resin on the second organic insulating layer to form a planarization layer, and forming an anode layer and a pixel defining layer on the planarization layer, and patterning the anode layer; and (i3) forming a hole in the pixel defining layer, and disposing a spacer on the pixel defining layer.

* * * * *